(12) United States Patent
Lopatin

(10) Patent No.: US 6,403,466 B1
(45) Date of Patent: Jun. 11, 2002

(54) POST-CMP-CU DEPOSITION AND CMP TO ELIMINATE SURFACE VOIDS

(75) Inventor: Sergey D. Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/805,651

(22) Filed: Mar. 13, 2001

(51) Int. Cl.$^7$ .......................................... H01L 21/4763

(52) U.S. Cl. ....................... 438/627; 438/628; 438/629; 438/633; 438/643; 438/644; 438/653; 438/654; 438/672; 438/687; 438/692

(58) Field of Search ................................. 438/627, 628, 438/629, 633, 643, 644, 653, 654, 672, 687, 692

(56) References Cited

U.S. PATENT DOCUMENTS 6,225,223 B1 * 5/2001 Liu et al. ..................... 438/687

* cited by examiner

Primary Examiner—John R. Niebling
Assistant Examiner—Lynne Gurley
(74) Attorney, Agent, or Firm—Mikio Ishimaru

(57) ABSTRACT

A manufacturing method for an integrated circuit is provided having a semiconductor substrate with a semiconductor device. A device dielectric layer is formed on the semiconductor substrate. A channel dielectric layer on the device dielectric layer has an opening formed therein. A barrier layer lines the channel opening. A seed layer is deposited over the barrier layer and a conductor core is deposited over the seed layer, filling the opening of in the channel dielectric layer. The seed and barrier layers are then removed above the dielectric layer. A conductive layer is then deposited, filling any voids or depressions in the conductor core, and is subsequently removed above the dielectric layer resulting in a conductive channel of uniform thickness.

19 Claims, 2 Drawing Sheets

POST-CMP-CU DEPOSITION AND CMP TO ELIMINATE SURFACE VOIDS

TECHNICAL FIELD

The present invention relates generally to integrated circuits and more particularly to controlling interconnect channel thickness therein.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two interconnect channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. An abrasiveless chemical is used for the chemical-mechanical polishing process in order to prevent abrasives from being left in the channel. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One of the major problems encountered during the CMP process is that it leaves behind voids in the center of the channel and at the interface between the channel and the barrier layer. Another significant problem present as a byproduct of the CMP process is a shallow crater or "dish" in wider channels due to a "dishing effect". All of these problems leave the surface in an undesirable state.

Because the CMP process is expected to leave a completely planarized surface, these unexpected voids make it difficult to control channel thickness. Channels with variable thickness are in turn subject to variable resistance levels, rendering devices unpredictable and therefore unusable. Channels with variable thickness can lead to a shorter time to failure. The CMP process used to remove the barrier and seed layers can also lead to a greater number of defects and leaves undesirable surface residue.

One problematic answer to this problem has been to provide very thick barrier layers, which provide large process margins during CMP. Unfortunately, these materials have relatively high resistance and tend to reduce the overall current-carrying capability of the channels.

A solution to this problem has been long sought but has long eluded those skilled in the art.

DISCLOSURE OF THE INVENTION

The present invention provides a manufacturing method for integrated circuits having a semiconductor substrate with a semiconductor device. A device dielectric layer is formed on the semiconductor substrate. A channel dielectric layer on the device dielectric layer has an opening provided therein. A barrier layer lines the channel opening. A seed layer is deposited over the barrier layer. A conductor core layer is deposited on the seed layer, filling the opening over the barrier layer and connecting to the semiconductor device. The seed and barrier layers are then removed above the dielectric layer with a first CMP process. An additional thin copper layer is then deposited over the surface and then planarized by a second CMP process which is less abrasive than the first CMP process. This results in reduced dishing, the elimination of voids, better planarization of metal layers, and uniform channel thicknesses without the drawbacks of increased resistance, shorter time to failure, and numerous surface defects and residues.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
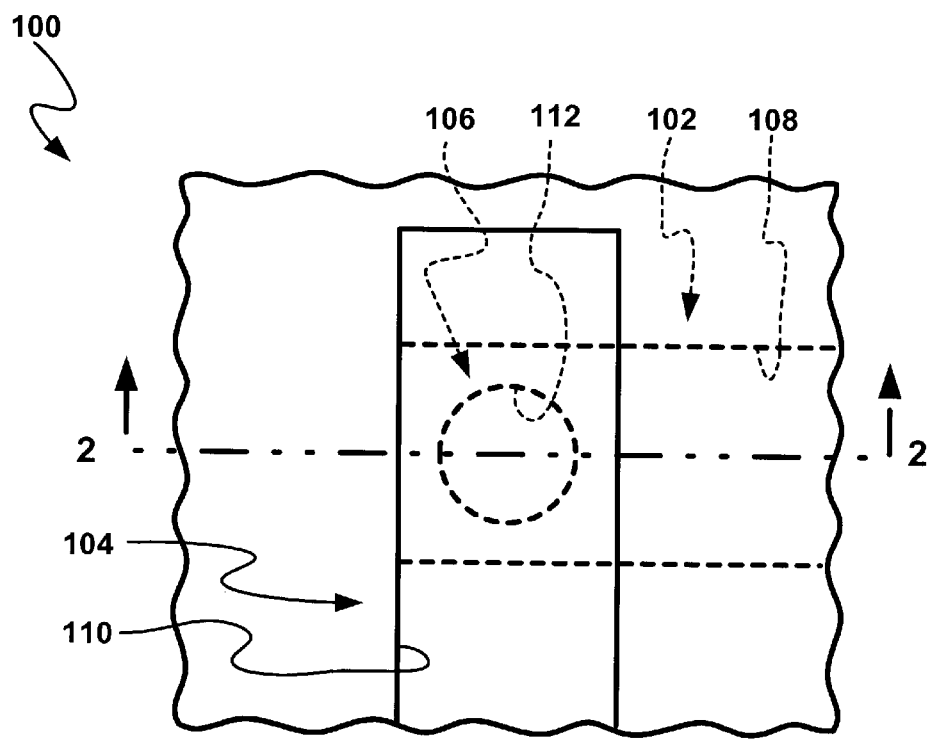
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
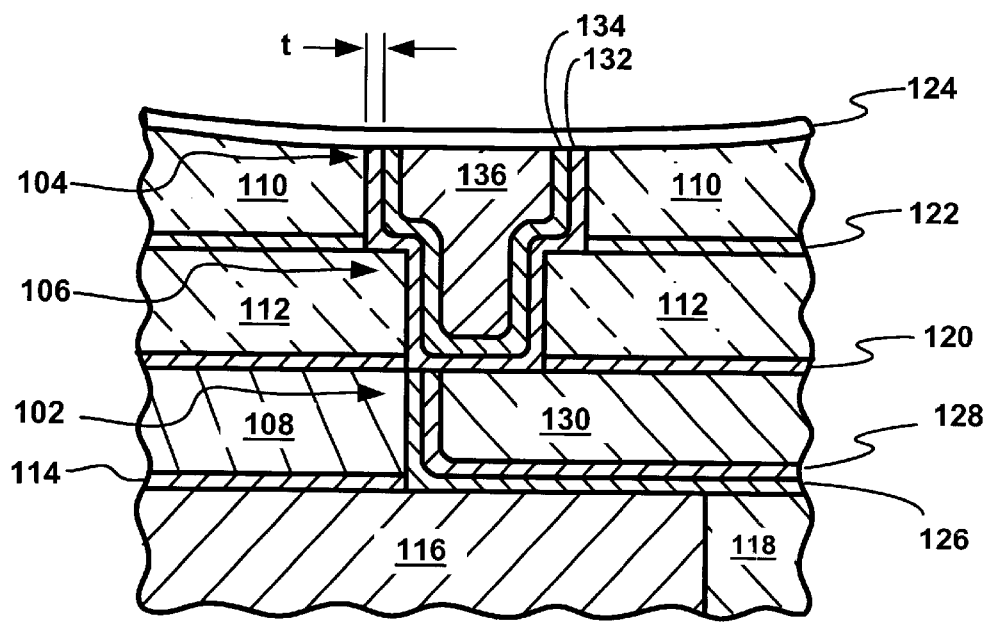
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of a first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) are used as barrier materials to prevent diffusion. In addition to increasing the overall resistance of the semiconductor chip which contained all the semiconductor devices, a barrier region 132 would block diffusion of copper from the conductor core 130 to the conductor core 136 as electromigration caused the movement of copper atoms out of the via 106 and allowed the formation of voids therein. Further, the interface between the barrier materials and copper does not form a strong bond and creates weak points for electromigration to occur.

Figure 3:
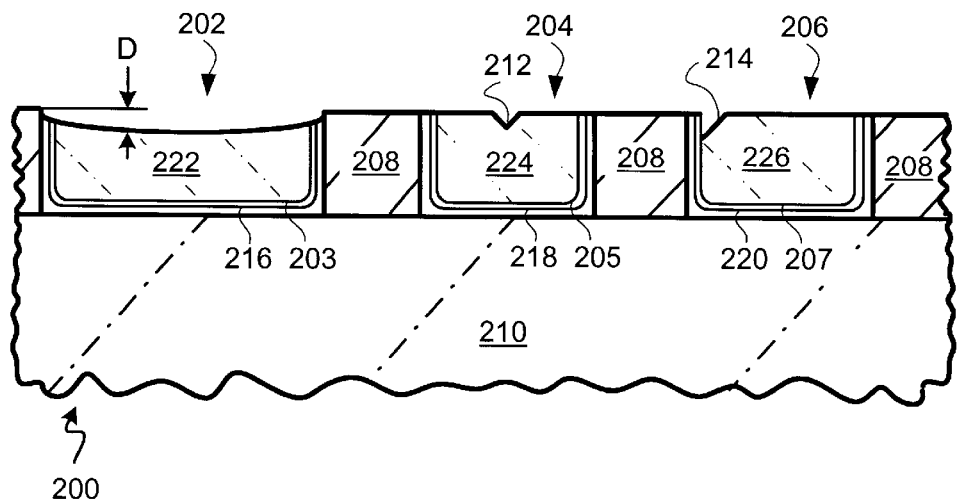
FIG. 3 (PRIOR ART) shows a step in the chemical-mechanical polishing process and depicts dishing and two types of surface voids in channels.

Referring now to FIG. 3 (PRIOR ART), therein is shown a step in the chemical-mechanical polishing (CMP) process in which a first channel surface of a semiconductor wafer 200 is planarized. Therein is thus shown the planarization of first, second, and third channels 202, 204 and 206. Each channel is composed of a corresponding conductor core 222, 224, or 226, a corresponding barrier layer 203, 205, or 207, and a corresponding seed layer 216, 218, or 220. Each channel is formed in a channel dielectric layer 208. A device dielectric layer 210 has been deposited as part of the semiconductor wafer 200.

In the CMP process, a flat polishing pad is used with a conventional CMP slurry containing abrasive particles. There are a number of different slurries known which consist of sized abrasive particles carried by a CMP solution. Different sized abrasive particles are used depending on the composition of the layer the CMP process is being performed on. Unfortunately, the CMP process is subject to a "dishing" effect, which is shown in the first channel 202 having a dish-like depression of depth D in the conductor core 222. In addition, the CMP process can produce defects such a voids at the center of a channel, shown as a void 212 in the center of the conductor core 224 in the second channel 204, and at the interface between a channel and a barrier layer, depicted as a void 214 at the interface between the conductor core 226 and the barrier layer 207 in the third channel 206. Both the dishing in the first channel 202 and the voids in the second and third channels 204 and 206 can occur separately or in combination and are shown separately to improve the clarity of the description.

Since the chemical selectivity of the CMP solutions is relatively low, for example for copper to tantalum nitride, they are in the range of 20 to 1, it is necessary to have relatively thick barrier layers 203, 205, and 207. If the barrier layers 203, 205, and 207 are too thin, the abrasive will abrade through the barrier layers 203, 205, and 207 and the CMP solution will remove both the conductor material in the channel, such as copper, as well as the dielectric material, such as silicon oxide, and cause the dishing effect responsible for the dish-like depression of depth D depicted in the first channel 202. The dishing effect shown in the first channel 202 occurs more noticeably on wide channels and contact pads. Both dishing and the formation of voids in the middle of a channel and at the channel/barrier layer interface can dramatically change the thickness of the channels and reduce their current-carrying capability.

Figure 4:
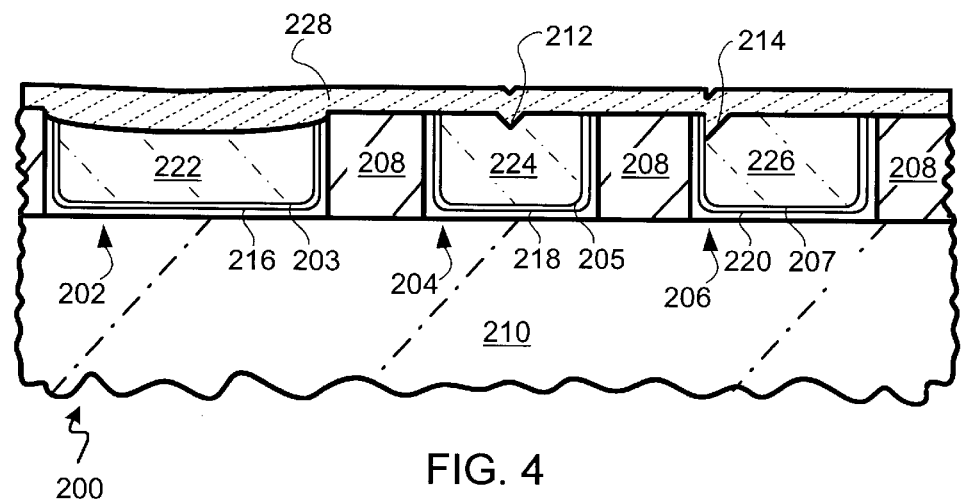
FIG. 4 is a side-view of a semiconductor wafer after the deposition of an additional thin Cu layer.

Referring now to FIG. 4, therein is shown the semiconductor wafer 200 as shown in FIG. 3 (PRIOR ART) with an additional thin layer of copper 228 deposed by a plasma vapor deposition (PVD) or chemical vapor deposition (CVD) process which fills the surface voids and dishing. As defined herein, "thin" as used for the additional layer of copper 228 is between 0.05 and 0.2 $\mu$m thick, which is an unexpected thickness.

Figure 5:
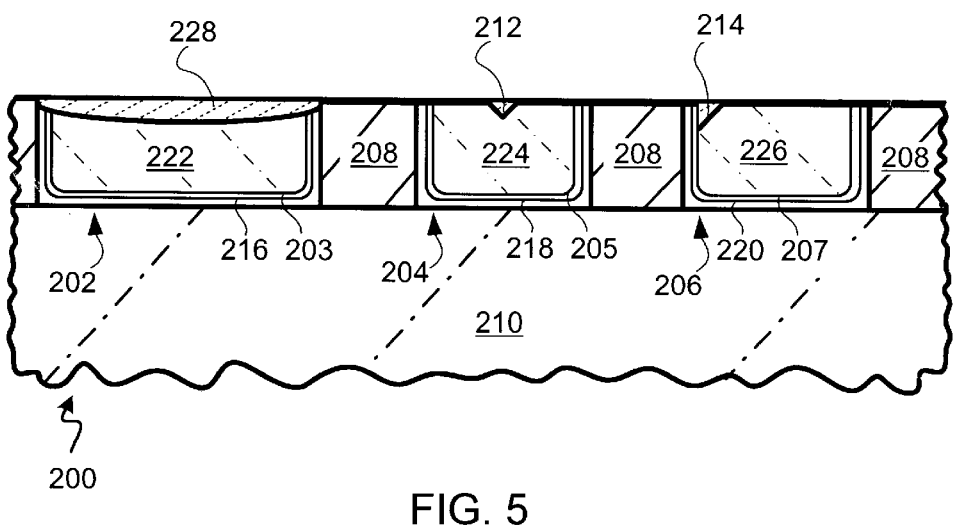
FIG. 5 is a side view of a semiconductor wafer after a chemical-mechanical polishing process and with a uniform channel thickness and eliminated voids in accordance with the present invention.

Referring now to FIG. 5, therein is shown the semiconductor wafer 200 as shown in FIG. 4 after the additional thin layer of copper 228 has been polished by a CMP process. Unlike the CMP process that originally caused the dishing in the first channel 202, the CMP process resulting in the polished surface in FIG. 5 uses less abrasive particles than that used in the prior art, or is abrasiveless. The use of a less-abrasive CMP process is necessary partially because the additional thin layer of copper 228 is softer and more easily polished than the barrier layer 203, 205, and 207 which required a more abrasive CMP process, and also because the low-k dielectric layer, typically made out of a porous dielectric material (dielectric constant around 2.0–2.2), requires a CMP process that doesn't affect its properties or adhesion. The CMP process can use a combination of techniques, such as the advanced approach of copper removal by electropolishing and abrasiveless CMP, together with very low mechanical pressure. Unfortunately, the copper electropolishing rate may be increased by a potential or concentration field around the etch pits at defective sites of the copper surface. Such advanced electropolishing-CMP combination can also lead to surface microvoids as a result of local etching at defective sites of copper channel surfaces. Fortunately, these microvoids, as well as the dishing seen in the conductor core 222 of the first channel 202 with depth D in FIG. 3 (PRIOR ART) and the voids 212 and 214 on the conductor cores 224 and 226, are filled by the additional thin layer of copper 228. As a result of this process, the final structure has a low-k porous dielectric layer that is not damaged by mechanical pressure and copper channel surfaces of more uniform thickness and without voids and dishing In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9, low dielectric constant dielectric materials such as fluorinated tetraethoxysilane (FTEOS), hydrogen silsesquioxane (HSQ), benzocyclobutene (BCB), etc. with dielectric constants below 3.9, or porous dielectric materials with dielectric constants around 2.0–2.2. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

a substrate having a device provided thereon;

forming a dielectric layer over the substrate;

forming an opening in the dielectric layer;

depositing a barrier layer to line the opening;

depositing a seed layer over the barrier layer;

depositing a conductor core layer over the seed layer, filling the opening in the dielectric layer;

removing the seed layer and barrier layer above the dielectric layer with a first chemical-mechanical process;

depositing a conductive layer over the conductor core layer wherein any voids or dishing in the conductor core are filled; and removing the conductive layer above the dielectric layer with a second chemical-mechanical polishing process wherein the second chemical-mechanical polishing process is a combination of electropolishing and abrasiveless CMP with very low mechanical pressure which is less abrasive than the first chemical-mechanical polishing process.

2. The method of manufacturing an integrated circuit as claimed in claim 1 wherein the second chemical-mechanical polishing process is an abrasiveless or low-abrasive chemical-mechanical polishing process.

3. The method of manufacturing an integrated circuit as claimed in claim 1 wherein depositing the conductive layer deposits a conductive layer with 0.05 and 0.2 $\mu$m.

4. The method of manufacturing an integrated circuit as claimed in claim 1 wherein deposit the dielectric layers deposit a material having a dielectric constant under 3.9.

5. The method of manufacturing an integrated circuit as claimed in claim 1 wherein depositing the barrier layer deposits a material selected from a group consisting of tantalum, titanium, tungsten, a compound thereof, and a combination thereof.

6. The method of manufacturing an integrated circuit as claimed in claim 1 wherein depositing the seed layer deposits a material selected from a group consisting of copper, gold, silver, a compound thereof, and a combination thereof.

7. The method of manufacturing an integrated circuit as claimed in claim 1 wherein depositing the conductor core layer deposits material selected from a group consisting of copper, gold, silver, a compound thereof, and a combination thereof.

8. The method of manufacturing an integrated circuit as claimed in claim 1 wherein depositing the conductive layer deposits material selected from a group consisting of copper, gold, silver, a compound thereof, and a combination thereof.

9. The method of manufacturing an integrated circuit as claimed in claim 1 wherein the first chemical-mechanical polishing process has a finite abrasiveness.

10. A method of manufacturing an integrated circuit comprising:

a semiconductor substrate having a semiconductor device provided thereon;

forming a dielectric layer over the semiconductor substrate;

forming an opening in the dielectric layer;

depositing a barrier layer to line the opening;

depositing a seed layer over the barrier layer;

depositing a conductor core layer over the seed layer, filling the opening in the dielectric layer;

removing the seed layer and barrier layer above the dielectric layer with a first chemical-mechanical process;

depositing a copper layer over the conductor core layer wherein any voids or dishing in the conductor core are filled; and removing the copper layer above the dielectric layer with a second chemical-mechanical polishing process wherein the second chemical-mechanical polishing process is an abrasiveless or low-abrasive chemical-mechanical polishing process.

11. The method of manufacturing an integrated circuit as claimed in claim 10 wherein the second chemical-mechanical polishing process is an abrasiveless or low-abrasive chemical-mechanical polishing process.

12. The method of manufacturing an integrated circuit as claimed in claim 10 wherein the first chemical-mechanical polishing process has a finite abrasiveness.

13. The method of manufacturing an integrated circuit as claimed in claim 10 wherein the second chemical-mechanical polishing process is a combination of electropolishing and abrasiveless CMP with very low mechanical pressure which is less abrasive than the first chemical-mechanical polishing process.

14. The method of manufacturing au integrated circuit as claimed in claim 10 wherein the second chemical-mechanical polishing process is an abrasiveless or low-abrasive chemical-mechanical polishing process.

15. The method of manufacturing an integrated circuit as claimed in claim 10 wherein depositing the copper layer deposits a copper layer with a thickness between 0.05 and 0.2 $\mu$m.

16. The method of manufacturing an integrated circuit as claimed in claim 10 wherein depositing the dielectric layers deposit a material having a dielectric constant under 3.9.

17. The method of manufacturing an integrated circuit as claimed in claim 10 wherein depositing the barrier layer deposits a material selected from a group consisting of tantalum, titanium, tungsten, a compound thereof, and a combination thereof.

18. The method of manufacturing an integrated circuit as claimed in claim 10 wherein depositing the seed layer deposits a material selected from a group consisting of copper, gold, silver, a compound thereof, and a combination thereof.

19. The method of manufacturing an integrated circuit as claimed in claim 10 wherein depositing the conductor core layer deposits material selected from a group consisting of copper, gold, silver, a compound thereof, and a combination thereof.

* * * * *